United States Patent [19]
Linderman

[11] Patent Number: 5,867,443
[45] Date of Patent: Feb. 2, 1999

[54] SHARED BITLINE HETEROGENEOUS MEMORY

[75] Inventor: Richard W. Linderman, Rome, N.Y.

[73] Assignee: The United States of America as represented by the Secretary of the Air Force, Washington, D.C.

[21] Appl. No.: 528,620

[22] Filed: Aug. 17, 1995

[51] Int. Cl.[6] .................................................. G11C 7/00
[52] U.S. Cl. .................... 365/228; 365/154; 365/230.03
[58] Field of Search ................................. 365/154, 156, 365/228, 230.03, 203

[56] References Cited

U.S. PATENT DOCUMENTS 5,353,251 10/1994 Uratani et al. ........................ 365/154
5,379,246 1/1995 Nogami ................................. 365/154
5,438,538 8/1995 Hashimoto ............................ 365/154

*Primary Examiner*—Son T. Dinh
*Attorney, Agent, or Firm*—William G. Auton; Harold L. Burstyn

[57] ABSTRACT

A five-transistor static Random Access Memory (SRAM) cell accessed by a single bitline merged with heterogeneous memories, such as ROMs, EPROMs, EEPROMs, and DRAMs. Combined ROM and RAM cells have been included within a high performance signal processor. Advantages include area and power dissipation savings resulting from shared column bitlines, associated column decoders, and column sense amplifiers. This eliminates circuit duplication.

11 Claims, 5 Drawing Sheets

SHARED BITLINE HETEROGENEOUS MEMORY

STATEMENT OF GOVERNMENT INTEREST

The invention described herein may be manufactured and used by or for Government purposes without the payment of any royalty.

BACKGROUND OF THE INVENTION

This invention relates to memory circuitry, and more specifically, to a memories which merge the bit lines of heterogeneous memory cells and concatenate rows of memory within single arrays, with a resultant sharing of bitlines, column decoders, and sense amplifiers.

The invention allows a single output bus for multiple memory components in lieu of one routed among the components. Traditionally, heterogeneous memory units have individual blocks of circuitry connected to shared data and address busses. For microcode data storage generally the address and data busses can have a width, for example, of 32, 64 or 128 bits, thus requiring a significant amount of routing area on integrated circuitry to connect memory blocks.

In addition, added area is needed, and power consumed, by replicating the functions of address decoders, array bitlines and sense amplifiers to detect data on bitlines for each heterogeneous memory. This loosely integrated approach, besides being larger and less power efficient, is more difficult to manage in the design hierarchy since the macrocells and all their subcells must be designed, debugged and maintained, instead of having a single merged macrocell.

The task of reducing power dissipation and circuit area required by architectures with mixed memories, by sharing bitlines, decoders, and sense amplifiers, and merging different memory cells into a single concatenated array, is alleviated, to some extent, by the systems described in the following U.S. patents, the disclosures of which are incorporated herein by reference: U.S. Pat. No. 5,325,323 to Nizaka; U.S. Pat. Nos. 5,323,342 & 5,313,418 to Wada et al; U.S. Pat. No. 5,313,420 to Masuoka; and U.S. Pat. No. 5,202,848 issued to Nakagawara.

The patent to Nakagawara discloses bitlines and column lines arranged alternately in common in each cell column, so as to be used in common by adjacent memory cells in a word line direction. The remaining patents are of similar interest.

SUMMARY OF THE INVENTION

The present invention merges the bitlines of heterogeneous memory cells and concatenates row blocks of heterogeneous memories within a single array, sharing bit lines, column decoders and sense amplifiers. This allows a single output bus, in lieu of one routed among multiple memory components. Thus while most static Random Access Memory (RAM) cells use 6 transistors and two bitlines, the invention permits eliminating one (1) transistor and one (1) bitline. As a result, critical RAM cell size is significantly reduced.

Such a reduced-size RAM cell, with five (5) instead of six (6) transistors, operates by writing from the bitline to the cell when a word line is at an upper voltage level, and the bitline is driven from an external source. To read from the reduced-size RAM cell, the bitline is raised to a lower voltage level, and the bitline is connected to a sense amplifier to detect the contents of the RAM cell.

Relative sizing of an input access transistor of the RAM memory cell in relation to inverters inside the memory cell implements dual voltage mode operation. The inverters are cross-coupled within the RAM cell. For example, the output of one inverter is cross-coupled to the input of another.

In effect, the two cross connected inverters form a multistate device known as a "flip-flop", i.e, there is a "flip" or change of voltage state when an enablement signal is applied, and there is a "flop" or a return to the original state when a further enablement signal is applied.

At a lower voltage the input access transistor cannot draw enough current to "flip" the cross-connected inverters within the cell. However, at the upper voltage the "flip" is accomplished. This voltage sizing merger permits a single bitline cell design and the elimination of area and power penalties for routing together separate memory macrocells.

The merger allows bitlines, column decoders, and sense amplifiers to be shared.

It is an object of the present invention to reduce the power dissipation of integrated circuits by merging heterogeneous memory cells and concatenating row blocks of heterogeneous memory within a single array that shares bitlines and column decoders.

It is another object of the present invention to reduce the physical area required by integrated circuits.

These and other objects, features and advantages of the invention will become more readily apparent after considering the following detailed description, taken in conjunction with the accompanying drawings wherein like elements are given like reference numerals throughout.

In accordance with the invention generally, a memory system includes a shareable data signal line, which can be a bitline, a memory cell connected to the data signal line for storing a data signal, and the capability for transferring a stored data signal from the cell to the line. The data signal line can extend between heterogeneous memory arrays.

When the data signal line is a databit line, the memory cell is connected to the databit line for storing a databit signal, and the transfer is of a stored databit signal from the cell to the line. The bitline cam extend between and among heterogeneous memory arrays.

A databit signal also can be transferred to the cell from the line, and the memory cell can include a multistate device provided, for example, by cross-coupled active elements. For a "read only" operation, the active elements can be field-effect devices connected in common. For "random access" operation the active elements can be field effect devices with gates cross-coupled to common drains.

The memory cell can include a bi-directional field-effect access switch connected to the multistate device, with the field sized relative to the multistate device such that when a higher voltage is applied, the memory contents are overwhelmed by a data bit, but when an intermediate voltage is applied, the memory contents are read out. When no voltage is applied, the memory cell is electrically isolated.

A pre-charge and write buffer is connected to the databit line, and the precharge and write buffer includes a data bus bit signal inverter connected to a transmission gate formed by parallel connected field-effect transistors. These transistors are activatable from an input control source and jointly connected to the access switch and a precharge bit line device.

The "write" voltage is produced by a CMOS inverter, and the "read" voltage is formed by an N-MOS transistor acting against a P-MOS transistor within the CMOS inverter to produce a lower voltage. In the memory system, the databit line can be connected to a single sense amplifier, and the bitline can extend from the memory cell in a RAM array to a ROM array.

In a method of the invention for forming a memory system, the steps include (a) providing a data signal line that extends among heterogeneous memory devices; (b) connecting a memory cell to the data signal line for storing a data signal; and (c) transferring a stored data signal from the cell to the line, or to the cell from the line.

By a further step (d) a bi-directional access switch is connected to the data signal line, which is, in turn, connected to a pre-charge and write buffer. The latter includes a data bus bit signal inverter connected to a transmission gate formed by parallel connected field-effect transistors activatable from an input control bus and jointly connected to a column of access switches and a precharge bit line device.

The method also includes the further steps of (e) operating the access switch from a word line that includes a CMOS inverter, the read voltage being formed by an N-MOS transistor acting against a P-MOS transistor to produce a lower voltage. This is to permit reading at a lower voltage than for writing. Still further steps include (f) extending the bitline from a memory cell in a RAM array to a ROM array through a field-effect transistor to permit simultaneous or individual operation of the arrays. The capacitance of the bitline is connected to the RAM array only when reading so that charge is saved and energy dissipation is reduced.

In a method of using a memory system of the invention the steps include (a) providing a data signal line that extends among heterogeneous devices; (b) connecting memory cells to the data line for storing data signals; and (c) transferring stored data signals from the cells to the line.

It will be appreciated that the memory cell may employ a standard flip-flop, so that two access devices are required, instead of the single, bi-directional access transistor of the invention, and still take advantage of the sharing of bitlines and data signal lines afforded by the invention.

DETAILED DESCRIPTION OF PREFERRED EMBODIMENTS

Figure 3:
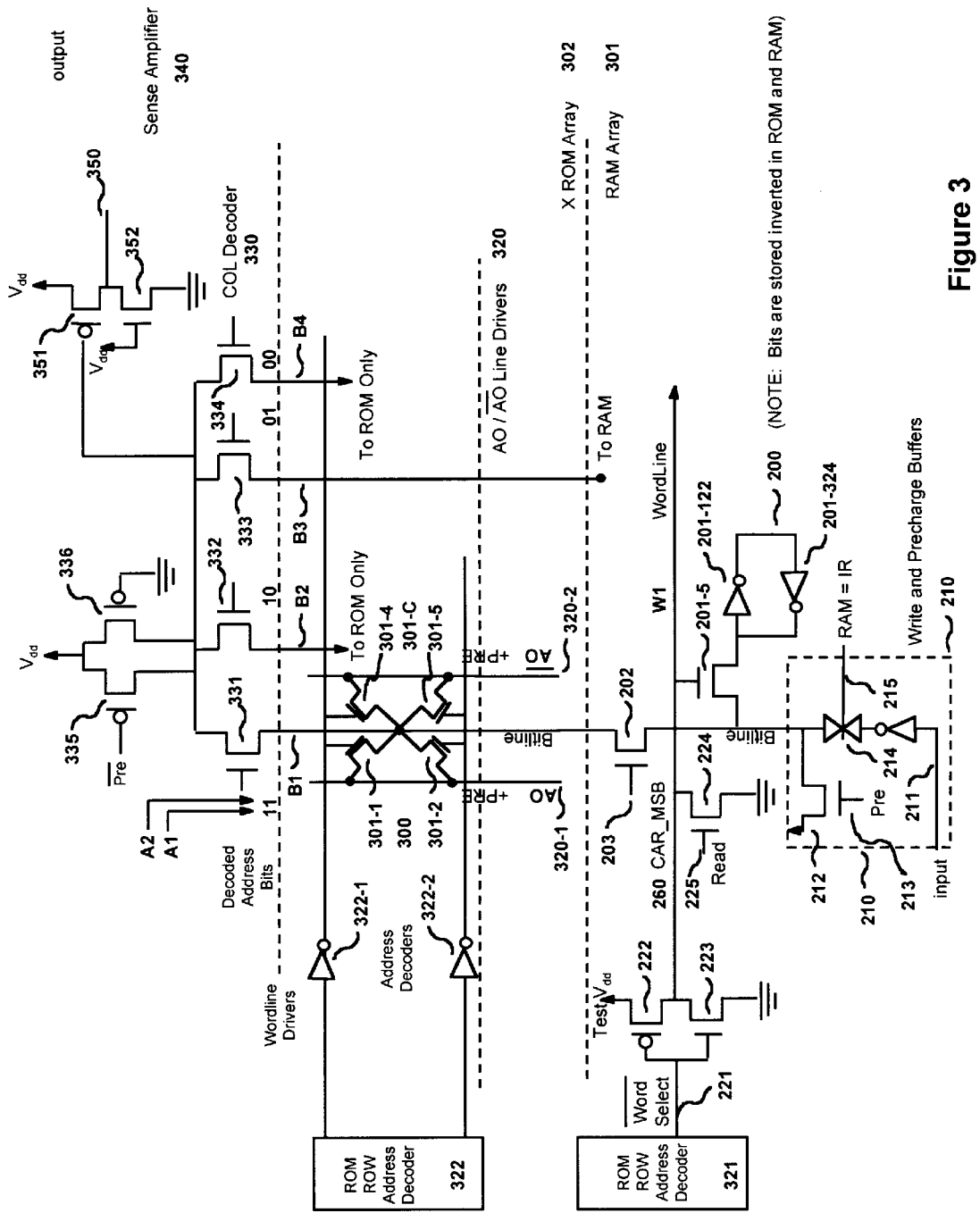
FIG. 3 is a block and circuit diagram of combined RAM and ROM arrays with shared sensing in accordance with the invention.
Figure 4A:
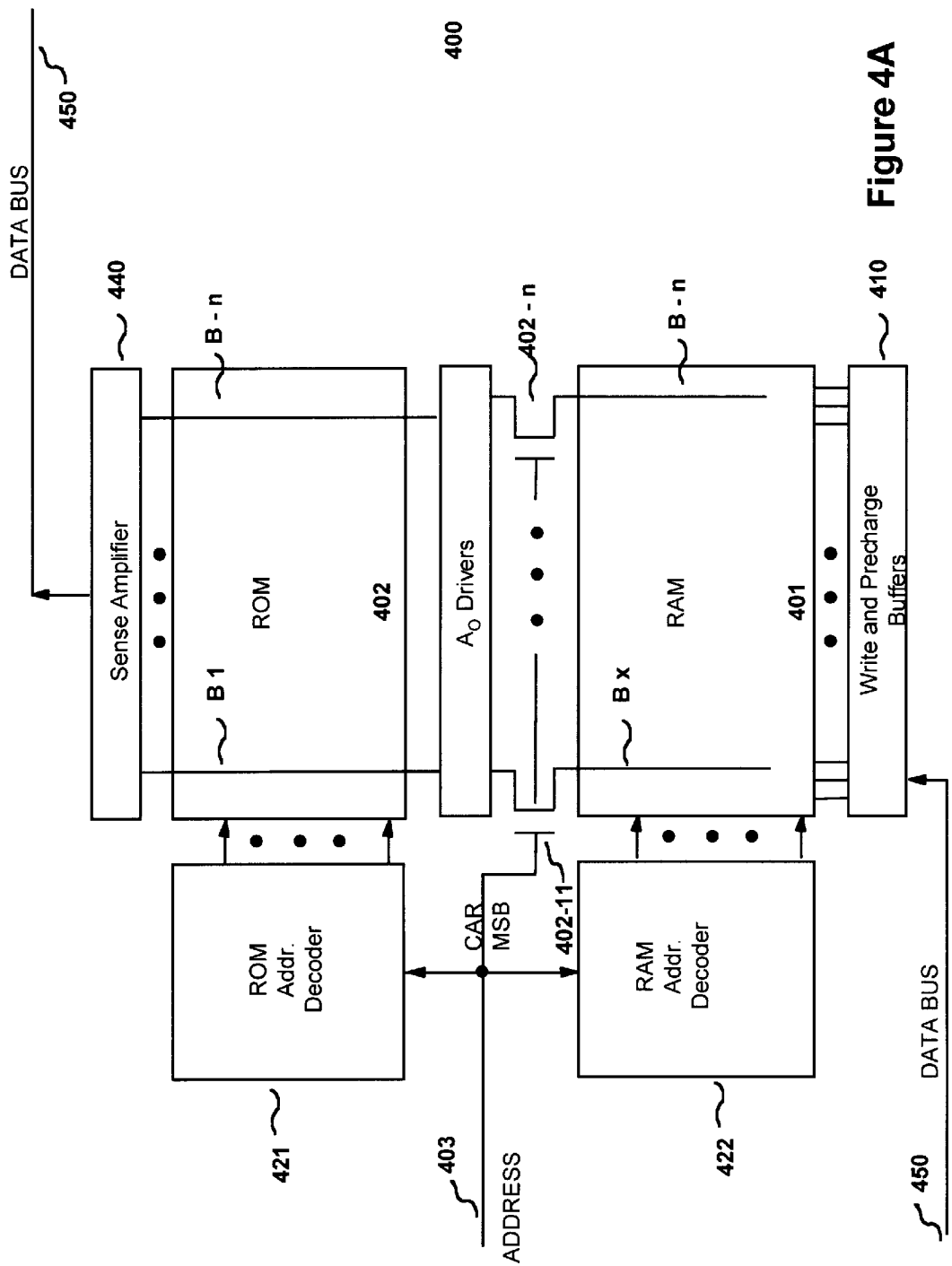
FIG. 4A is a block diagram of a merged RAM/ROM storage system.
Figure 4B:
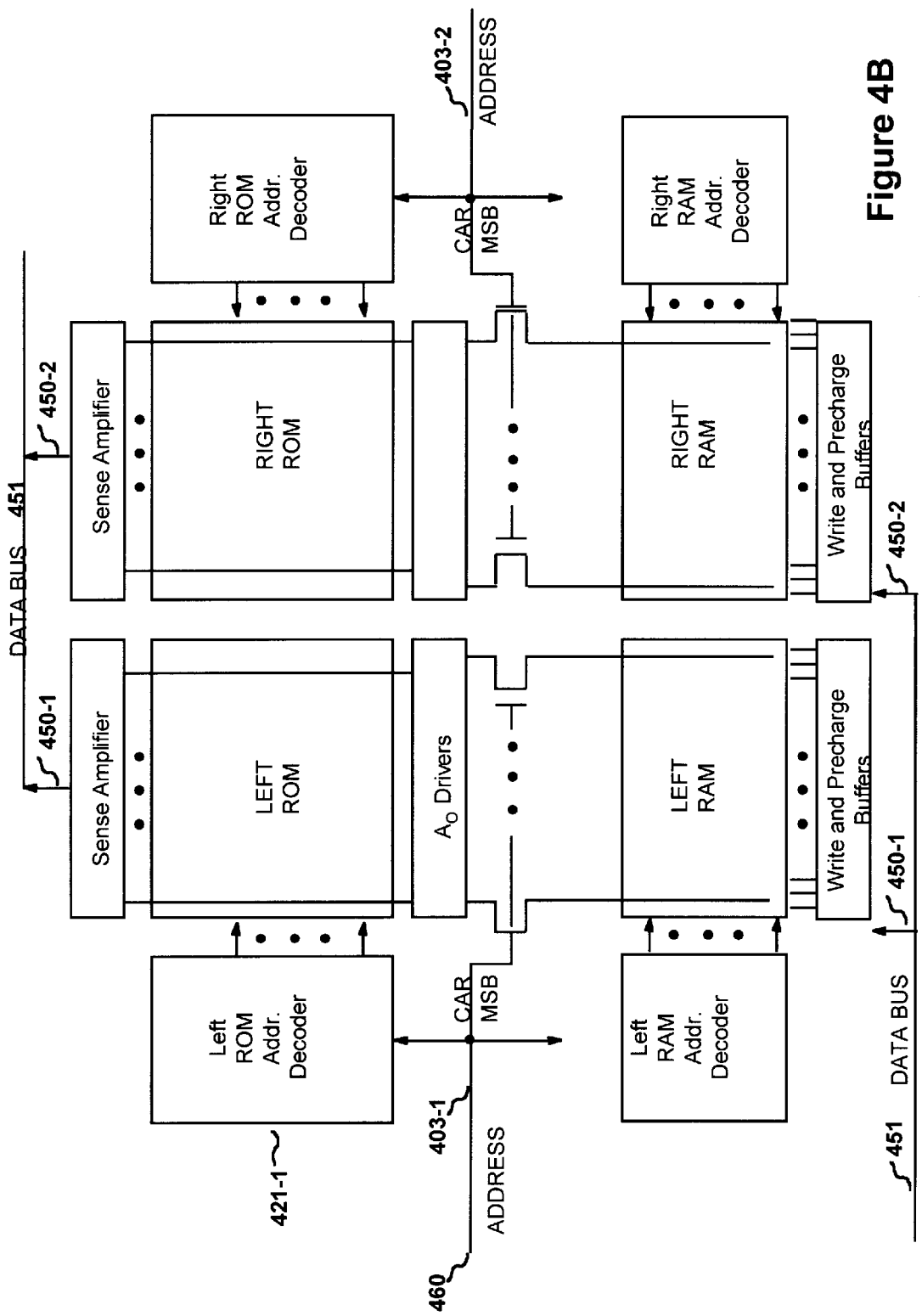
FIG. 4B is a block diagram of a merged and expanded RAM/ROM storage system of the invention.

The present invention provides a heterogeneous memory system which merges the bitlines of heterogeneous memory cells and concatenates row blocks of heterogeneous memory within a single array. There is a resultant sharing of bitlines, column decoders and sense amplifiers. This allows a single access to an output bus as shown in FIGS. 3, 4A and 4B, in lieu of the need for routing a data bus among multiple memory components as shown in FIG. 1 of the prior art.

The principal purpose of the invention is to reduce the power dissipation and circuit area required by architectures with mixed memory types. This is accomplished by sharing bitlines, column decoders, and sense amplifiers, and by merging different types of memory cells into a single concatenated array.

Figure 1:
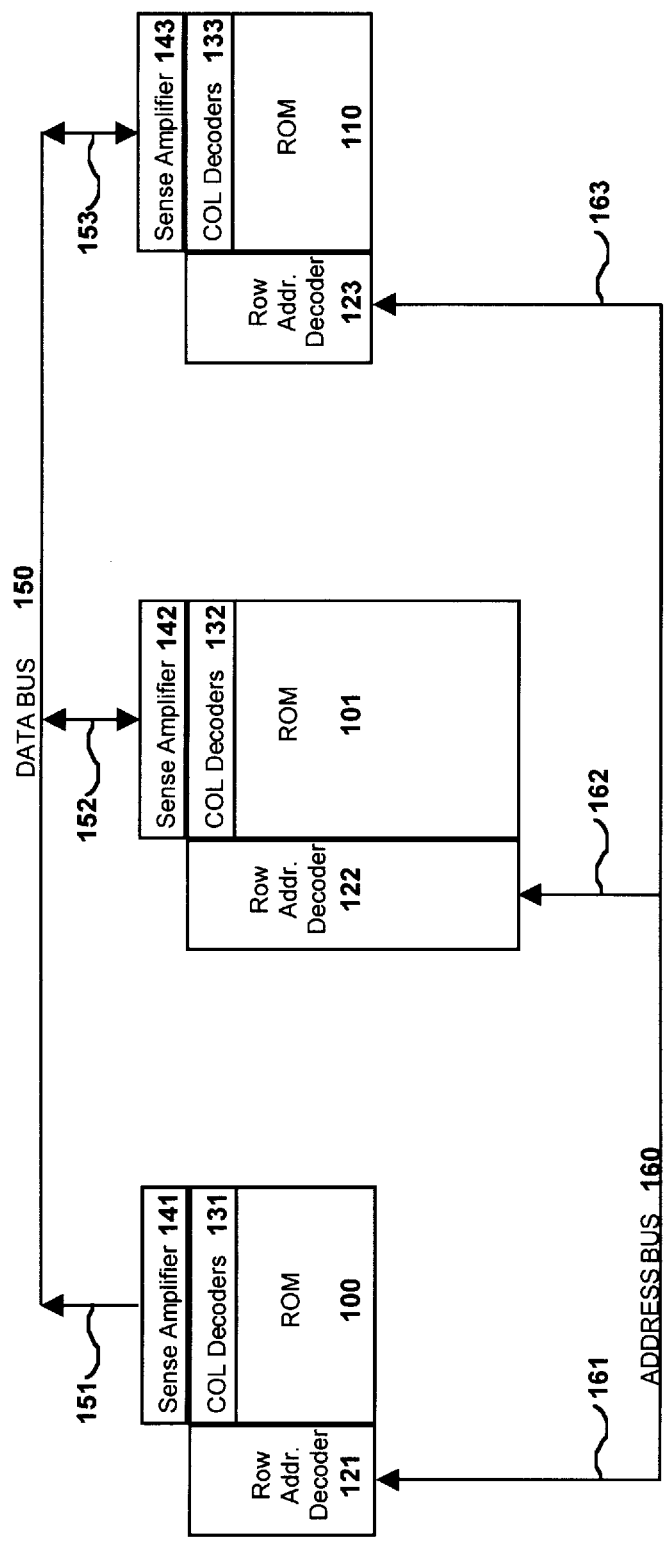
FIG. 1 is a block diagram of a prior art memory bussing system.

To understand the significance of the merger of different types of memory cells, reference is made to FIG. 1, which shows the traditional approach to the combination of heterogeneous memory types. In the architecture of FIG. 1, each memory type has its own block of circuitry separately connected to data and address busses.

Thus the memory bussing system of FIG. 1 has separate connections 151, 152 and 153 to a data bus 150 for a ROM (Read Only Memory) 100, a RAM (Random Access Memory) 101, and an EEPROM (Electrically Erasable Programmable Read Only Memory) 110. The bussing system of FIG. 1 has further, separate connections 161–163 to an address bus 160. It will be noted that the connections 152 and 153 to and from the RAM 101 and ROM 100 are bi-directional.

For microcode and data storage in general, the busses 150 and 160 must provide an electrical path for a large number of bits. Typically there are 32, 64 or 128 bits in the path, requiring a significant area for routing the path on an integrated circuit in order to connect the blocks 100, 101 and 110. It will be noted that in the illustrative addressing the two most significant bits are used so that block 100 is addressed by bits "00", block 101 is addressed by bits "01" and block 110 is addressed by bits "10". Thus, the address bits are indicated by the suffix digits in the block designations. Additional area and power are needed for replicating the functions of the address decoders (ROW Addr. Decoders) 121–123, column bitlines (COL Decoders) 131–133 and sense amplifiers 141–143 (above the COL Decoders) to detect the data on the bitlines within each memory array (ROM, RAM or EEPROM), for each of the heterogeneous memory types, i.e., ROM, RAM and EEPROM. This loosely integrated approach, besides being larger and less power efficient, is more difficult to manage in the overall design hierarchy since the RAM, ROM and EEPROM macrocells, and all of their subcells, must be debugged, and maintained, instead of having a single merged macrocell with a reduced set of subcells.

As mentioned above, the present invention merges the bitlines of heterogeneous memory cells and concatenates row blocks of heterogeneous memory within a single array by sharing bitlines, column decoders and sense amplifiers. This allows a single output bus routed from one overall source to a destination, in lieu of a multi-element bus routed from multiple sources, e.g., multiple memory components.

To achieve multi-component compatibility, e.g., with ROMs, Laser Programmable ROMs (LPROMs), DRAMs (Dynamic Random Access Memories), EPROMs (Electrically Programmable Read Only Memories) and EEPROMs, the invention uses static RAM cells that are each associated with a single bitline.

Most static RAM cells require six transistors and two bitlines. By eliminating one transistor and one bitline per cell, the invention significantly reduces critical RAM cell size. A five-transistor RAM cell 200 of the invention, with an associated wordline W1 and bitline B1, is shown in FIG. 2.

Figure 2:
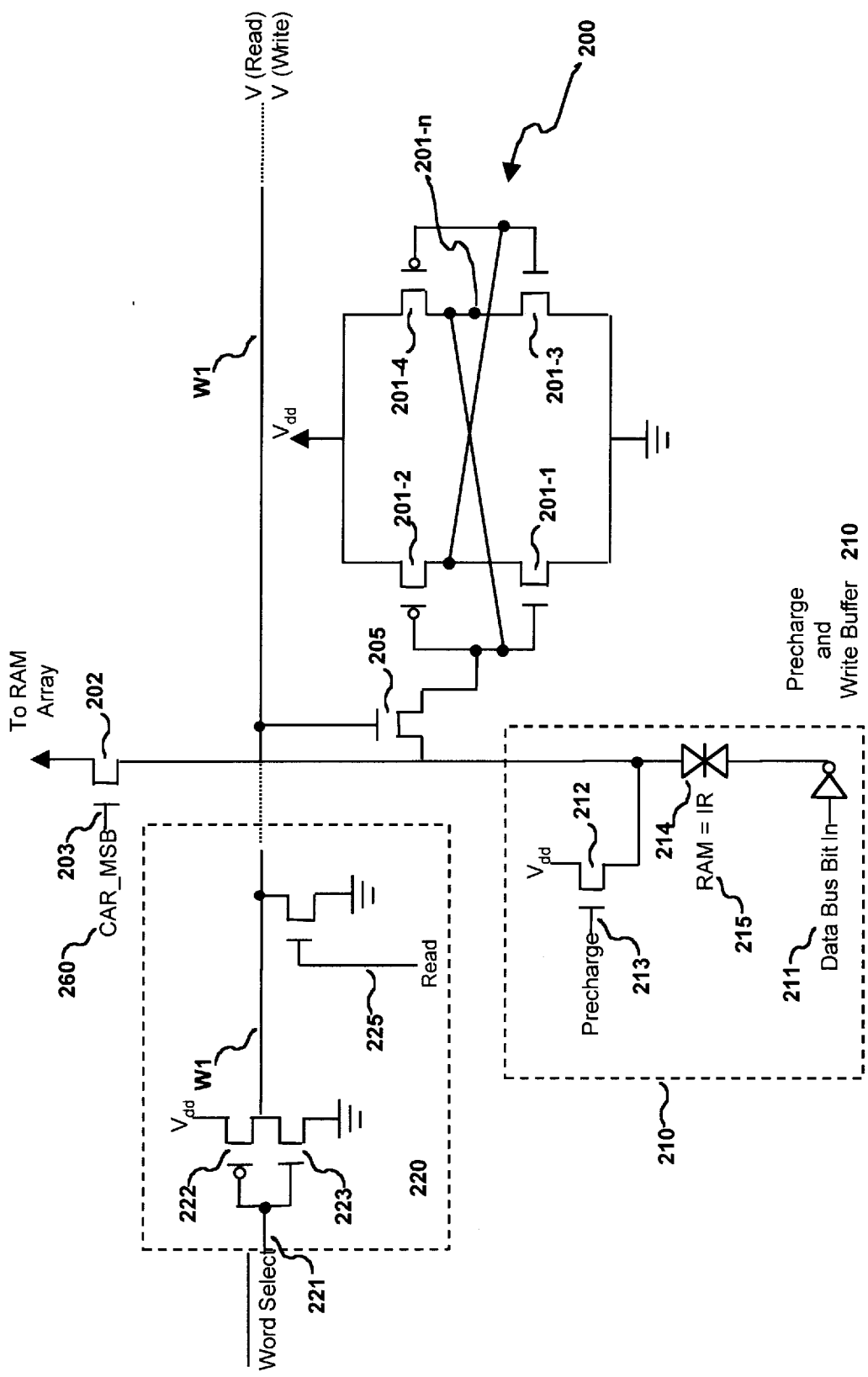
FIG. 2 is a block and circuit diagram of the invention for a RAM array including a five-transistor RAM storage cell.

The five-transistor cell 200 of FIG. 2 is formed by field-effect transistors 201-1 though 201-5. The cell 200 is written from the bitline B1 when the wordline W1 is raised to an appropriate bias level. For the cell 200, its access transistor 201-5 is raised by the wordline W1 to the drain electrode bias level Vdd, illustratively positive 5.0 volts. The bitline B1 is then driven from a precharge and write buffer 210.

To read the cell 200, the bitline B1 is raised to a lesser voltage than for writing, to approximately 2.5 volts, and connected through a gate 202 to a sense amplifier (340 shown in FIG. 3) to detect the contents of the cell 200. Relative sizing of the access transistor 201-5 of the memory cell 200 in relation to the inverters inside the memory cell 200 implements this dual mode operation in which a relatively low voltage is used for reading and a relatively high voltage is used for writing. At 2.5 volts the access transistor 201-5 cannot pass enough current to "flip" the cross coupled inverters within the cell 200, and the electrical state of the cell 200 appears on the bitline B1. However, at 5.0 volts a "flip" can be accomplished so that the electrical state of the cell 200, as indicated by the voltage at the node 201-n, can correspond to the input data at terminal 211 for writing.

While the preferred embodiment uses 2.5 volts to read, and 5.0 volts to write, these values can vary depending upon the threshold voltage level necessary to enable the access transistor 201-5 to flip the cross coupled inverters 201-2 and 201-4. Thus, the "read" voltage may range from 1.0–3.0 volts, and the "write" voltage may range from 4.0–6.0 volts.

The read/write signal on the wordline W is produced in the buffer 220 where an inverse of the wordline signal is applied at the Word Select terminal 221. The bar over the designation "Word Select" indicates inversion, and the signal is applied from a RAM row address decoder as indicated in FIG. 3.

A P-MOS inverter 222 is connected in parallel with an N-MOS transistor 223 to pull the wordline W to the Vdd level of about 5.0 volts when a "Word Select" signal appears. For reading, however, the transistor 224, which is enabled by the read terminal 225, pulls the voltage to the approximate 2.5 volt level for reading.

The signal that is actually written is controlled by the Precharge and Write Buffer 210. A precharge signal of about Vdd is applied from a transistor 211 at a precharge terminal 212.

In FIG. 3 the bitline B1 of the cell 200 extends to the cross point 300-c of a ROM cell 300, and then to a column decoder 330.

The ROM cell 300 is formed by field-effect transistors 301-1 through 301-4, which have their gates connected to respective Address Decoder inverters 322-1 and 322-2. A bit value of "1" is stored by appropriate retention or omission of transistors; otherwise a "0" is stored.

In addition the drains of the transistors are driven by precharge and line drivers 320 on lines 320-1 and 320-2. "AO" designates addressing by the "0"'th order address bit, and "$\overline{AO}$" indicates the inverse of the "0"'th order bit.

As noted, the bitline B1 from the RAM cell 200 and the ROM cell 300 extends to the COL (column) Decoder 330, which is included within the sense amplifier 340. The decoded address bits indicate which of the bitlines B1 though B4 is operated for connection to the sense amplifier 340. Thus to connect the bitline B1 to the sense amplifier 340, the address bits A1 and A2 are respectively "1" and "1", as indicated at the input of the decoder transistor 331. To engage bitline B2, the address bits are "10" at transistor 332; "01" at transistor 333 and "00" at transistor 334.

Precharge and weak resistive pull-up to Vdd are supplied through transistors 335 and 336. The output is the junction of transistors 351 and 352.

Thus, by using five-transistor static RAM cells 200, the RAM array 301 can be merged with a ROM array 302, with shared column decoders 330 and sense amplifiers 340 as shown in FIG. 3 for the implemented case of a High Performance Signal Processor ("HPSP"). The row decoders 331 and 332 are separate and different for the two subarrays 301 and 302 and, like the arrays, are stacked atop each other, as indicated in FIG. 4A. The HPSP can be doubled as indicated in FIG. 4B.

If the CAR_MSB (Control Address Register—Most Significant Bit) signal on line 403 in FIG. 4 is a logical 0, the ROM 402 can be read at the same time the RAM 401 is written, since the bitlines B1 thruough Bn are split into isolated sections. In microstore designs, where new microword must be read every clock cycle, this allows the control of the RAM 401 to be updated, without breaking into two arrays with separate sense amplifiers and column decoders.

The use of a five-transistor, single bitline Static RAM cells, like the cell 200, allows the RAM array 401 of many cells 200 to be merged with other single bitline memory types. This eliminates area and power penalties for routing together separate memory macrocells and allows bitlines, column decoders, and sense amplifiers to be shared, further saving area and power.

Design complexity is also reduced by reducing the number of cell types and macrocells in the overall design. For example, different sense amplifiers 440 are no longer required for the various memory macrocells 401 and 402. Sense amplifiers are critical and complicated in design and to debug.

In a broad sense, as shown in FIGS. 4A and 4B, the present invention provides a memory system 400 with shared bitlines B1 through Bn and a single data bus line 450; a RAM array which receives data from the single data bus line 450 when prompted by a first voltage signal on address line 403 and outputs data onto the single data bus line 450 when prompted by a second voltage signal on address line 403.

For this shared bitline memory system 400, the RAM array includes a memory cell 200 which stores a databit signal, and an access transistor 201-5 which triggers the RAM memory cell 200 circuit to store and to output the data signal as required. Supporting the RAM cell operation is a generating voltage source connected to line 403 of FIGS. 4A and 4B which outputs a 2.5 voltage signal as a first voltage control signal, and also outputs a 5.0 voltage signal as a second voltage control signal. While a merged RAM/ROM has been designed and simulated, the invention extends to many possible mergers and combinations of heterogeneous memory cell types including DRAM, SRAM, EPROM, and EEPROM.

While the invention has been described in its presently preferred embodiment, it is to be understood that the words used have been those of description rather than of limitation and that changes within the purview of the appended claims may be made without departing from the scope and spirit of the invention in its broader aspects.

I claim:

1. A memory system comprising:
   at least one shareable data signal line that extends between heterogeneous memory devices;
   at least one memory cell connected to said at least one shareable data signal line for storing a data signal; and
   means for transferring a stored data signal from said at least one memory cell to said at least one shareable data signal line.

2. A memory system as defined in claim 1 wherein each data signal line is a data bitline;

said at least one memory cell, for storing a databit signal, is a one of connected to and disconnected from said data bitline;

said means for transferring is effective to transfer a stored databit signal from said at least one memory cell to said data bitline; and said means for transferring is further effective to transfer a stored databit signal from said data bitline to said at least one memory cell.

3. A memory system as defined in claim 2 wherein said data bitline extends from at least one memory cell in a RAM array to at least one memory cell in a ROM array.

4. A memory system as defined in claim 2 for ROM operation wherein:

said at least one memory cell includes a field effect transistor;

said field effect transistor is connected to said data bitline to store a bit value of 1; and said field effect transistor is disconnected from said data bitline to store a bit value of 0.

5. A memory system as defined in claim 2, said memory system being effective for ROM operation, wherein:

said at least one memory cell includes a field effect transistor connected to said data bitline to store a bit value of 1; and said data bitline has a default bit value of 0.

6. A memory system as defined in claim 2, said memory system being effective for RAM operation, wherein:

said means for transferring includes a read voltage and a write voltage;

said at least one memory cell comprises a bidirectional access switch connecting said data bitline to a pair of cross-coupled CMOS inverters;

said bidirectional access switch is operated from a word line driven by a CMOS inverter and an N-MOS transistor; and said N-MOS transistor acts against said CMOS inverter to produce said read voltage lower than said write voltage.

7. A memory system as defined in claim 6 wherein:

said write voltage placed on said word line is effective for causing said databit signal on said data bitline to be transferred to said memory cell; and said read voltage placed on said word line is effective for causing said databit signal to be transferred from said memory cell onto said data bitline.

8. The method of forming a memory system comprising the steps of:

(a) providing a data bitline that extends among heterogeneous memory devices;

(b) storing a data bit by connecting a cross-coupled memory cell to said data bitline by means of bidirectional access switch;

(c) transferring a stored data bit from said at least one memory cell to said data bitline, or to said at least one memory cell from said data bitline;

(d) connecting said data bitline to a write buffer that includes a data bus bit signal inverter connected to a transmission gate formed by parallel connected field-effect transistors activatable by an input write control signal and connected to at least one access switch; and (e) connecting a pre-charge field effect transistor to said data bitline, thereby facilitating the interconnection of said heterogenous memory devices and bringing said data bitline to a voltage that enables a fast read of said stored data bit.

9. The method of forming a memory system as defined in claim 8 comprising the further steps of:

(f) operating said bidirectional access switch from a word line driven by a CMOS inverter and an N-MOS transistor; and (g) forming a read voltage by said N-MOS transistor acting against said CMOS inverter to produce a lower voltage, thereby enabling said read voltage to be lower than a write voltage.

10. The method of forming a memory system as defined in claim 8 comprising the further steps of:

(h) extending said data bitline from said memory cell in a RAM array to a ROM array through a field-effect transistor; thereby enabling simultaneous operation of said RAM and ROM arrays; and (i) connecting the capacitance of said data bitline to said RAM array only when reading, whereby charge is saved and energy dissipation reduced.

11. The method of using a memory system comprising the steps of:

(a) providing a shareable data signal line that extends among heterogeneous devices;

(b) connecting memory cells to said data line for storing data signals; and (c) transferring stored data signals between said memory cells and said data signal line.

* * * * *